(12) United States Patent
Samejima et al.

(10) Patent No.: US 8,148,647 B2
(45) Date of Patent: Apr. 3, 2012

(54) PRINTED CIRCUIT BOARD AND METHOD OF MANUFACTURING THE SAME

(75) Inventors: Souhei Samejima, Chiuyoda-ku (JP); Sadao Sato, Chiyoda-ku (JP); Hiroyuki Osuga, Chiyoda-ku (JP); Shigeru Utsumi, Chiyoda-ku (JP); Teruhiko Kumada, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 293 days.

(21) Appl. No.: 11/832,376

(22) Filed: Aug. 1, 2007

(65) Prior Publication Data

US 2008/0047742 A1    Feb. 28, 2008

(30) Foreign Application Priority Data

Aug. 23, 2006  (JP) .................................. 2006-226775
Sep. 5, 2006   (JP) .................................. 2006-240200

(51) Int. Cl.
    *H05K 1/11* (2006.01)
(52) U.S. Cl. .................... 174/266; 174/260; 174/262
(58) Field of Classification Search ........... 174/260–266
    See application file for complete search history.

(56) References Cited

U.S. PATENT DOCUMENTS

| | | | | |
|---|---|---|---|---|
| 5,130,179 A * | 7/1992 | Miyazaki et al. | ............ | 428/209 |
| 5,576,362 A * | 11/1996 | Watanabe et al. | ............ | 523/440 |
| 5,733,823 A * | 3/1998 | Sugioka et al. | ............ | 442/110 |
| 6,512,182 B2 * | 1/2003 | Takeuchi et al. | ............ | 174/256 |
| 6,514,616 B1 * | 2/2003 | Gandi et al. | ............ | 428/408 |
| 6,613,413 B1 * | 9/2003 | Japp et al. | ............ | 428/131 |
| 6,753,483 B2 * | 6/2004 | Andoh et al. | ............ | 174/262 |
| 6,869,664 B2 * | 3/2005 | Vasoya et al. | ............ | 428/209 |
| 7,038,142 B2 * | 5/2006 | Abe | ............ | 174/255 |
| 7,388,157 B2 * | 6/2008 | Abe et al. | ............ | 174/256 |
| 2005/0276958 A1 * | 12/2005 | Komurasaki et al. | ......... | 428/209 |

FOREIGN PATENT DOCUMENTS

| | | |
|---|---|---|
| JP | 8-97556 | 4/1996 |
| JP | 11-40902 | 2/1999 |
| JP | 2003-46022 | 2/2003 |
| JP | 2003-273482 | 9/2003 |
| JP | 2006-114606 | 4/2006 |
| JP | 2006-222216 | 8/2006 |

OTHER PUBLICATIONS

Office Action issued Feb. 22, 2011 in Japan Application No. 2006-240200 (With English Translation).

* cited by examiner

*Primary Examiner* — Ishwarbhai Patel
(74) *Attorney, Agent, or Firm* — Oblon, Spivak, McClelland, Maier & Neustadt, L.L.P.

(57) ABSTRACT

An object of the invention is to provide a printed circuit board that has an excellent heat dissipation performance and excellent reliability, and its manufacturing method. The printed circuit board includes: prepregs (2*a*) and (2*b*) being cured after each covering the surfaces of a metal plate (1) provided with first throughholes (1*a*) therein and the inner walls of the first throughholes (1*a*); prepregs (4*a*) and (4*b*) being cured after glass clothes (3*a*) and (3*b*) are sandwiched between the prepregs (2*a*) and (2*b*), and the prepregs (4*a*) and (4*b*), respectively; and second throughholes (8) that connect wiring layers (7*a*) and (7*c*), and (7*b*) and (7*d*) provided on both surfaces of prepregs (6*a*) and (6*b*), respectively. The prepregs (2*a*) and (2*b*) and the prepregs (4*a*) and (4*b*) are characterized in that they contain inorganic filler. Furthermore, the prepregs (2*a*) and (2*b*) and the prepregs (4*a*) and (4*b*) may contain elastomer.

4 Claims, 13 Drawing Sheets

FIG.6

| | filler content [%-vol.] | mixing rate [%-vol.] resin | mixing rate [%-vol.] elastomer | melt viscosity [Ps·s] | formability of B-stage sheet | thermal conductivity [W/mK] | filling performance | throughhole reliability core layer | | sticking performance |
|---|---|---|---|---|---|---|---|---|---|---|
| practical example 1 | 10 | 100 | 0 | less than 30,000 | good | 0.3 | good | aluminum | good | good |
| practical example 2 | 20 | 100 | 0 | less than 30,000 | good | 0.4 | good | aluminum | good | good |
| practical example 3 | 30 | 100 | 0 | less than 30,000 | good | 0.6 | good | aluminum | good | good |
| practical example 4 | 40 | 100 | 0 | less than 30,000 | good | 0.8 | good | aluminum | good | good |
| practical example 5 | 50 | 100 | 0 | less than 30,000 | good | 1 | good | aluminum | good | good |
| practical example 6 | 60 | 100 | 0 | less than 30,000 | good | 2 | good | aluminum | good | good |
| practical example 7 | 65 | 100 | 0 | less than 30,000 | good | 3 | good | aluminum | good | good |
| practical example 8 | 70 | 100 | 0 | 14,000 | good | 4 | good | aluminum | good | good |
| practical example 9 | 75 | 100 | 0 | around 30,000 | good | 6 | good | aluminum | good | good |
| comparative example 1 | 0 | 100 | 0 | 1,000 | good | 0.2 | good | aluminum | good | good |
| comparative example 2 | 80 | 100 | 0 | more than 30,000 | good | 8 | NG | aluminum | . | . |
| comparative example 3 | 85 | 100 | 0 | . | NG | . | . | aluminum | . | . |

FIG.7

| | filler content [%-vol.] | mixing rate [%-vol.] resin | mixing rate [%-vol.] elastomer | melt viscosity [Ps·s] | formability of B-stage sheet | thermal conductivity [W/mK] | filling performance | throughhole reliability core layer | | sticking performance |
|---|---|---|---|---|---|---|---|---|---|---|
| practical example 10 | 65 | 90 | 10 | less than 30,000 | good | 3 | good | aluminum | good | good |
| practical example 11 | 65 | 80 | 20 | less than 30,000 | good | 3 | good | aluminum | good | good |
| practical example 12 | 65 | 70 | 30 | 10,000 | good | 3 | good | aluminum | good | good |
| practical example 13 | 65 | 60 | 40 | less than 30,000 | good | 3 | good | aluminum | good | good |
| practical example 14 | 65 | 50 | 50 | less than 30,000 | good | 3 | good | aluminum | good | good |
| practical example 15 | 75 | 95 | 5 | around 30,000 | good | 6 | good | aluminum | good | good |
| practical example 16 | 75 | 90 | 10 | less than 30,000 | good | 6 | good | aluminum | good | good |
| practical example 17 | 75 | 80 | 20 | less than 30,000 | good | 6 | good | aluminum | good | good |
| practical example 18 | 75 | 70 | 30 | less than 30,000 | good | 6 | good | aluminum | good | good |
| practical example 19 | 75 | 60 | 40 | less than 30,000 | good | 6 | good | aluminum | good | good |
| practical example 20 | 80 | 80 | 20 | around 30,000 | good | 8 | good | aluminum | good | good |
| practical example 21 | 80 | 70 | 30 | around 30,000 | good | 8 | good | aluminum | good | good |
| comparative example 4 | 65 | 40 | 60 | | | | | aluminum | | NG |
| comparative example 5 | 75 | 50 | 50 | | | | | aluminum | | NG |
| comparative example 6 | 80 | 95 | 5 | | NG | 8 | | aluminum | | . |
| comparative example 7 | 80 | 90 | 10 | more than 30,000 | good | 6 | NG | aluminum | | . |
| comparative example 8 | 80 | 60 | 40 | | . | | | aluminum | | NG |
| comparative example 9 | 85 | 90 | 10 | | NG | | | aluminum | | . |
| comparative example 10 | 85 | 70 | 30 | | NG | | | aluminum | | . |

FIG.8

| | filler content [%vol.] | mixing rate [%-vol.] resin | elastomer | melt viscosity [Ps·s] | formability of B-stage sheet | thermal conductivity [W/mK] | filling performance | throughhole reliability core layer | sticking performance |
|---|---|---|---|---|---|---|---|---|---|
| practical example 22 | 60 | 100 | 0 | less than 30,000 | good | 2 | good | CFRP good | good |
| practical example 23 | 65 | 100 | 0 | less than 30,000 | good | 3 | good | CFRP good | good |
| practical example 24 | 70 | 100 | 0 | 14,000 | good | 4 | good | CFRP good | good |
| comparative example 11 | 50 | 100 | 0 | less than 30,000 | good | 1 | good | CFRP NG | good |
| comparative example 12 | 75 | 100 | 0 | around 30,000 | good | 6 | good | CFRP NG | good |

FIG.9

| | filler content [%·vol.] | mixing rate [%·vol.] resin | mixing rate [%·vol.] elastomer | melt viscosity [Ps·s] | formability of B-stage sheet | thermal conductivity [W/mK] | filling performance | throughhole reliability core layer | sticking performance |
|---|---|---|---|---|---|---|---|---|---|
| practical example 25 | 65 | 90 | 10 | less than 30,000 | good | 3 | good | CFRP | good |
| practical example 26 | 65 | 80 | 20 | less than 30,000 | good | 3 | good | CFRP | good |
| practical example 27 | 65 | 70 | 30 | 10,000 | good | 3 | good | CFRP | good |
| practical example 28 | 65 | 60 | 40 | less than 30,000 | good | 3 | good | CFRP | good |
| practical example 29 | 65 | 50 | 50 | less than 30,000 | good | 3 | good | CFRP | good |
| practical example 30 | 75 | 90 | 10 | less than 30,000 | good | 6 | good | CFRP | good |
| practical example 31 | 75 | 80 | 20 | less than 30,000 | good | 6 | good | CFRP | good |
| practical example 32 | 75 | 70 | 30 | less than 30,000 | good | 6 | good | CFRP | good |
| practical example 33 | 75 | 60 | 40 | less than 30,000 | good | 8 | good | CFRP | good |
| practical example 34 | 80 | 80 | 20 | around 30,000 | good | 8 | good | CFRP | good |
| practical example 35 | 80 | 70 | 30 | less than 30,000 | good | 8 | good | CFRP | good |
| comparative example 13 | 65 | 40 | 60 | . | . | . | . | CFRP | NG |
| comparative example 14 | 75 | 95 | 5 | around 30,000 | good | 6 | good | CFRP | good |
| comparative example 15 | 75 | 50 | 50 | . | . | . | . | CFRP | NG |
| comparative example 16 | 80 | 95 | 5 | . | NG | 8 | . | CFRP | . |
| comparative example 17 | 80 | 90 | 10 | more than 30,000 | good | 8 | NG | CFRP | . |
| comparative example 18 | 80 | 60 | 40 | . | . | . | . | CFRP | NG |
| comparative example 19 | 85 | 90 | 10 | . | NG | . | . | CFRP | . |
| comparative example 20 | 85 | 70 | 30 | . | NG | . | . | CFRP | . |

FIG.10
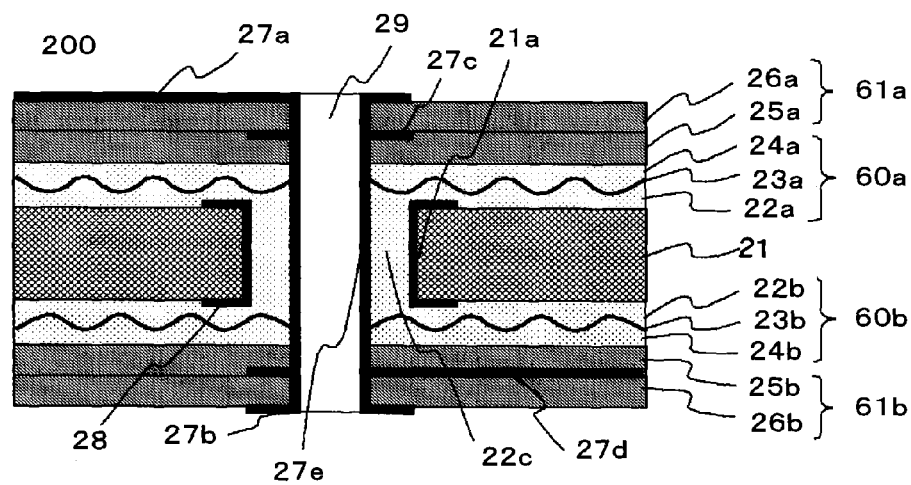
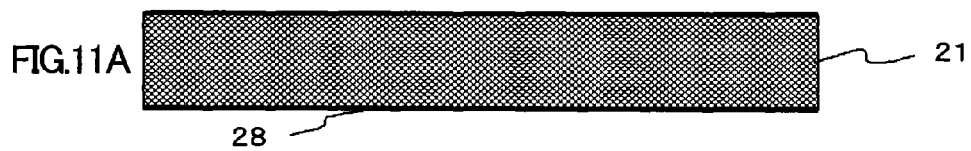
FIG.11A
FIG.11B
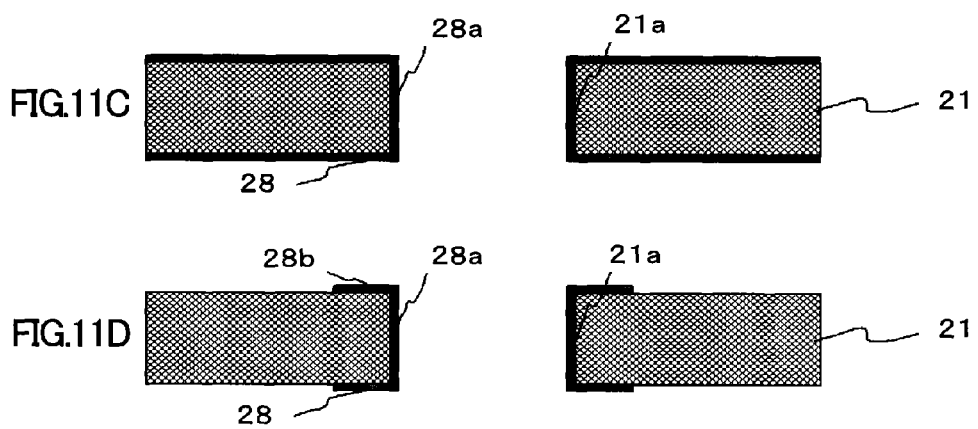
FIG.11C
FIG.11D

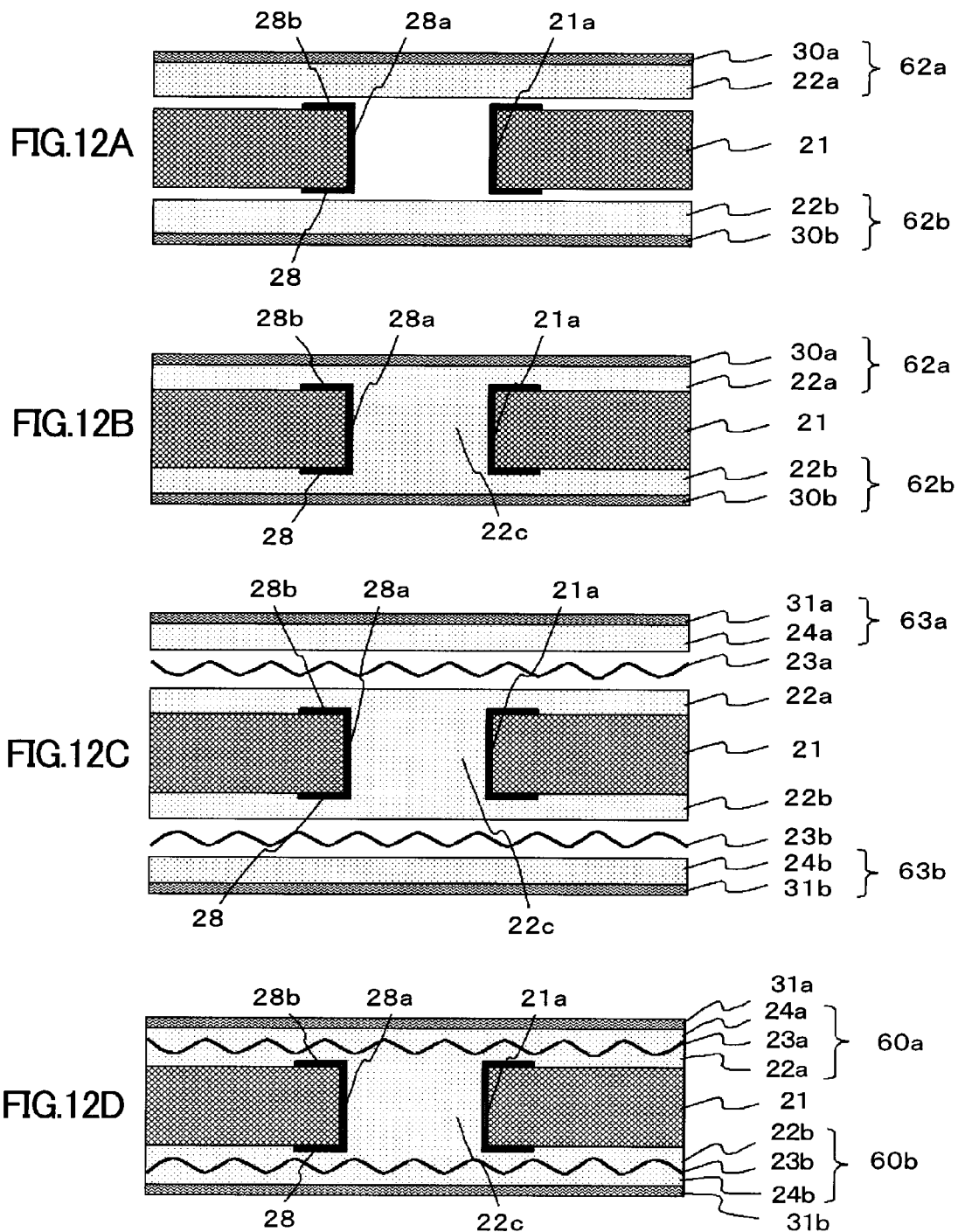

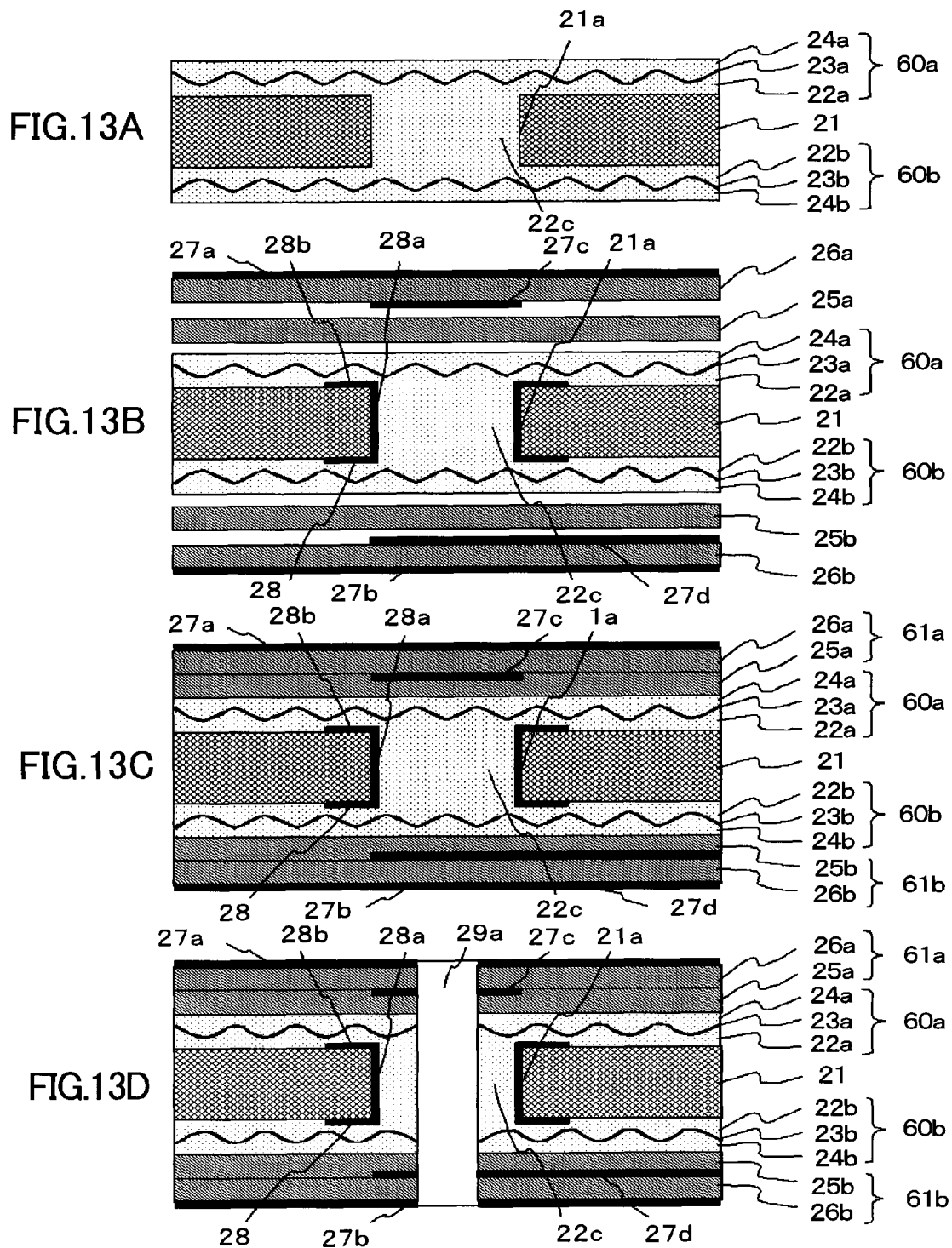

PRINTED CIRCUIT BOARD AND METHOD OF MANUFACTURING THE SAME

BACKGROUND OF THE INVENTION

1. Field of the Invention

The present invention relates to printed circuit boards and their manufacturing methods, more particularly, to printed circuit boards having an excellent heat dissipation performance and their manufacturing methods.

2. Description of the Prior Art

Recently, there is a growing need for printed circuit boards having a high heat dissipation performance as electronic components are being mounted in high-density. A metal core substrate has been known as a printed circuit board having a high heat dissipation performance and has already been used in practice. The metal core substrate, in which a metal of high thermal conductivity such as aluminum and copper is used as its core material, can disperse heat from heat generating components over the substrate, which prevents the heat generating components from rising in temperature. Among others, aluminum, which has a thermal conductivity of 236 W/mK and a specific gravity of 2.7 g/cm$^3$, is a relatively lightweight material; hence used generally for core materials (for example, refer to Japanese Laid-Open Patent No. 1996-97556, para. [0006], FIG. 8).

Nowadays, carbon fiber reinforced plastic (hereinafter abbreviated to "CFRP") is also considered as another core material that has a lower thermal expansion, higher strength, and lighter weight than those of aluminum (for example, refer to Japanese Laid-Open Patent No. 1999-40902, para. [0008]-[0015], FIG. 9).

CFRP is a composite material that is composed of carbon fiber and resin, and its thermal expansivity, thermal conductivity, strength, and specific gravity are tunable by varying its carbon fiber content and structure such as cross structure or unidirectional structure (for example, refer to Japanese Laid-Open Patent No. 2003-273482, para. [0034]-[0049], FIG. 16). Generally, carbon fiber having thermal conductivity of 140 to 800 W/mK is available on the market. By being laminated with prepregs containing an unidirectional structure carbon fiber of a thermal conductivity of 620 W/mK with their fiber orientations being in order of 0°, 90°, 90°, and 0°, a CFRP plate can be obtained that has a thermal expansivity of approximately 0 ppm/°C. (in plane), a thermal conductivity of 217 W/mK, an elastic modulus of 290 GPa, and a specific gravity of 1.6 g/cm$^3$. The CFRP plate, while keeping heat dissipation performance comparable with that of aluminum, exhibits as a core material a lower thermal expansivity, higher strength, and lighter weight than those of aluminum. Accordingly, by making a core substrate with the CFRP, a substrate can be obtained that has a higher performance, in particular, a more excellent mounting reliability than those of aluminum, without occurrence of cracks at soldered connection portions even in a case of large ceramic parts being mounted.

Since any core materials mentioned above, however, are electrically conductive, a core layer and throughholes formed for connecting wirings provided over both surfaces of the core are necessarily isolated from each other by covering the throughholes with a filling resin. If the throughholes are filled with a conventional prepreg, the heat dissipation is governed by the resin-filled portions due to its low heat conductivity of 0.2 W/mK, which causes a problem in that heat from heat generating components is inefficiently transferred to the core. In addition, when the throughholes are formed by a conventional manufacturing method using the CFRP as the core material, the carbon fiber exposed to the walls of the throughholes is, different from a case of using aluminum, easy to be pulverized into carbon powder, so that the powder is dispersed into the resin in the successive process of filling resin, which causes a problem that reduces electrical insulation quality between the CFRP core and the throughholes or may, in some case, lead to a short circuit therebetween. Moreover, in forming counterbored portions on a metal core substrate for heat dissipation, the pulverized carbon powder is dispersed over the wirings or other substrates in the substrate manufacturing equipment, which causes a short circuit.

SUMMARY OF THE INVENTION

The present invention has been made to solve those problems described above. A first object of the invention is to provide a printed circuit board having an excellent heat dissipation performance and its manufacturing method, and a second object is to provide a printed circuit board having an excellent insulation reliability and its manufacturing method.

A printed circuit board according to an aspect of the present invention includes a core layer that is provided with a first throughhole therein; prepreg layers containing inorganic filler that is cured after covering the inner wall of the first throughhole and both surfaces of the core layer; circuit layers that are formed on both surfaces of the prepreg layers; and a second throughhole, having a diameter smaller than that of the first throughhole, that is formed approximately coaxially with the first throughhole, for electrically connecting wiring layers formed on/in the circuit layers through both sides of the first throughhole formed in the prepregs layers and through the inner wall of the first throughhole covered with the prepreg layers.

A method of manufacturing a printed circuit board according to an aspect of the present invention includes a process of forming on both surfaces of a core layer having been provided with a first throughhole therein prepreg layers for, by hot-pressing prepregs containing inorganic filler, filling the first throughhole inside and covering the entire core layer.

A printed circuit board according to another aspect of the invention includes a protection film that covers both surfaces of a carbon-fiber-reinforced-plastic core layer provided with a first throughhole, and the inner wall thereof; prepreg layers that cover both the covered surfaces of the core layer and the covered inner wall of the first throughhole both covered with the protection film; circuit layers that are formed each on the outer surfaces of prepreg layers; and a second throughhole, having a diameter smaller than that of the first throughhole, that is formed approximately coaxially with the first throughhole, for electrically connecting both wiring layers formed on the circuit layers through the inner wall of the first throughhole having been covered with the prepreg layers.

A method of manufacturing a printed circuit board according to another aspect of the invention includes a process of forming a protection film on both surfaces of a carbon-fiber-reinforced-plastic core layer having been provided with a first throughhole therein and on the inner wall of the first throughhole.

According to the present invention, by using prepreg layers containing inorganic filler for the resin-filled portion in the first throughhole, heat is efficiently transferred from heat generating components to the core layer by the resin-filled portion through the inner wall of the throughhole.

Moreover, according to the invention, by covering with a protection film the wall of the first throughhole formed in the carbon-fiber-reinforced-plastic core layer, carbon fiber can be prevented from pulverized into carbon powder, which brings about improvement of insulation reliability between the carbon-fiber-reinforced-plastic core and the second throughhole, and prevention of the carbon powder from dispersing into the substrate manufacturing equipment, contaminating the other substrates, and causing a short circuit.

BRIEF DESCRIPTION OF THE DRAWINGS

FIG. 6 is a table showing results of evaluating molded sample characteristics in Practical Examples 1 through 9 and comparative examples 1 through 3 of the printed circuit board according to the invention;

FIG. 7 is a table showing results of evaluating molded sample characteristics in Practical Examples 10 through 21 and comparative examples 4 through 10 of the printed circuit board according to the invention;

FIG. 8 is a table showing results of evaluating molded sample characteristics in Practical Examples 22 through 24 and comparative examples 11 and 12 of the printed circuit board according to the invention;

FIG. 9 is a table showing results of evaluating molded sample characteristics in Practical Examples 25 through 35 and comparative examples 13 through 20 of the printed circuit board according to of the invention;

FIG. 10 is a cross-sectional view illustrating a configuration of a printed circuit board of Embodiment 2 according to the present invention;

FIGS. 11A through 11D are views illustrating processes in a method of manufacturing the printed circuit board of Embodiment 2 according to the invention;

FIGS. 12A through 12D are views illustrating processes in the method of manufacturing the printed circuit board of Embodiment 2 according to the invention;

FIGS. 13A through 13D are views illustrating processes in the method of manufacturing the printed circuit board of Embodiment 2 according to the invention;

DETAILED DESCRIPTION OF PREFERRED EMBODIMENTS

Embodiments of the present invention will be explained in detail below.

Embodiment 1

Figure 1:
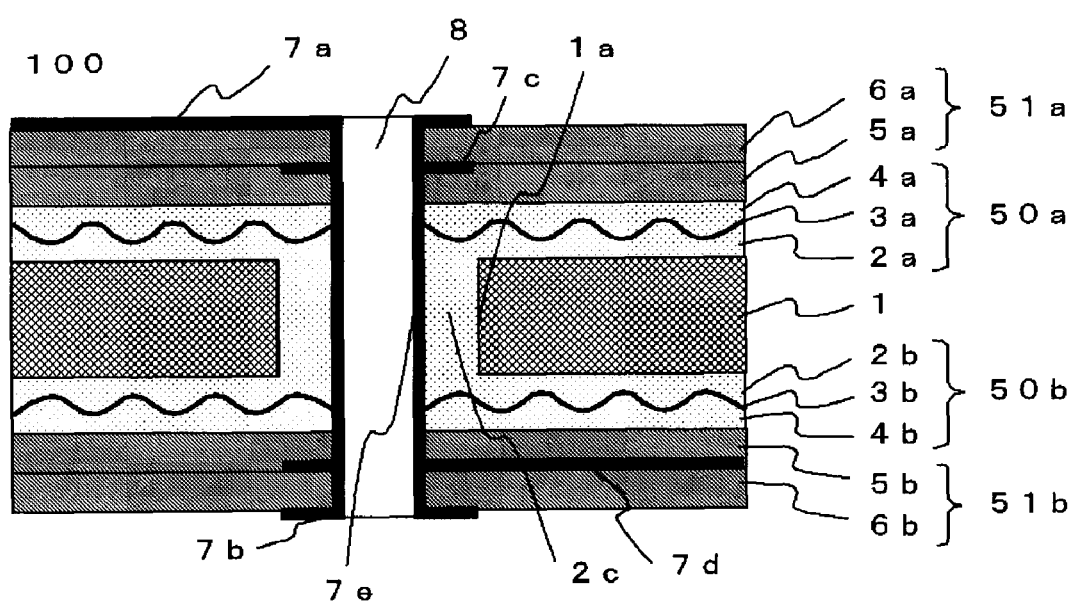
FIG. 1 is a cross-sectional view illustrating a configuration of a printed circuit board of Embodiment 1 according to the present invention.

FIG. 1 is a cross-sectional view illustrating a configuration of a printed circuit board 100 in Embodiment 1 of the present invention. Referring to FIG. 1, the printed circuit board 100 is configured with a metal plate 1 as a core layer, and prepregs 2a and 2b as first prepreg layers, glass clothes 3a and 3b as first glass clothes, and prepregs 4a and 4b as second prepreg layers, which are laminated successively in that order on both surfaces of the metal core 1, respectively, so that respective insulation layers 50a and 50b are formed.

Prepregs 5a and 5b as third prepreg layers, and prepregs 6a and 6b as forth prepreg layers are successively laminated on the outer surfaces of the insulation layers 50a and 50b, respectively, so that circuit layers 51a and 51b are formed thereon. The circuit layers 51a and 51b are provided with wiring layers 7a and 7c, and 7b and 7d, respectively: the wiring layers 7a and 7b, and 7c and 7d are formed in predetermined patterns on the outer and middle surfaces of the circuit layers 51a and 51b, respectively.

The metal plate 1 is provided with first throughholes 1a therein, and second throughholes 8 penetrating the printed circuit board 100 are formed in the centers of the first throughholes 1a. The wiring layers 7a and 7c, and 7b and 7d formed on the circuit layers 51a or 51b, respectively, are connected with wiring layers 7e formed on the inner walls of the second throughholes 8, so as to be electrically conducted to one another. The second throughholes 8 have diameters smaller than those of the first throughholes 1a and electrically isolated from the metal plate 1 by filled portions 2c that have been filled with the prepregs 2a and 2b.

The prepregs 2a and 2b, the filled portions 2c, and the prepregs 4a and 4b are made of thermosetting resin containing inorganic filler. The following materials are used as the thermosetting resin: epoxy, bismaleimide, cyanate ester, polyimide, and the like. As the inorganic filler, alumina, silica, magnesia, aluminum nitride, boron nitride, silicon nitride, and the like are known, and at least one of them is used. Prepregs made of a glass cloth, defined as a second glass cloth, impregnated with thermosetting resin are used for the prepregs 5a and 5b and the prepregs 6a and 6b.

Containing inorganic filler in the thermosetting resin used for the prepregs 2a and 2b and the prepregs 4a and 4b improves heat dissipation to the metal plate 1 from heat generating components (not shown) connected to the second throughholes 8. A rate of the inorganic filler content in the thermosetting resin is preferably 75%-vol. or less; a content rate exceeding 75%-vol. reduces filling performance of the first throughholes 1a.

Next, the manufacturing method will be explained. FIGS. 2A through 2E and FIGS. 3A through 3D are cross-sectional views illustrating processes of manufacturing the printed circuit board 100 in Embodiment 1: FIGS. 2A through 2E illustrate processes of forming the insulation layers 50a and 50b, and FIGS. 3A through 3D, those of forming the circuit layers 51a and 51b.

Figure 2A:
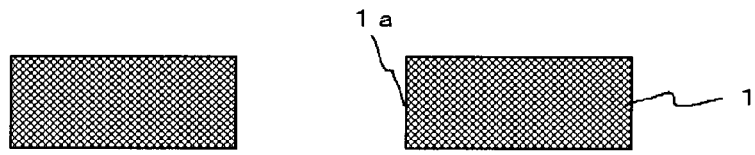
FIGS. 2A through 2E are views illustrating processes in a method of manufacturing the printed circuit board of Embodiment 1 according to the invention.
Figure 2B:
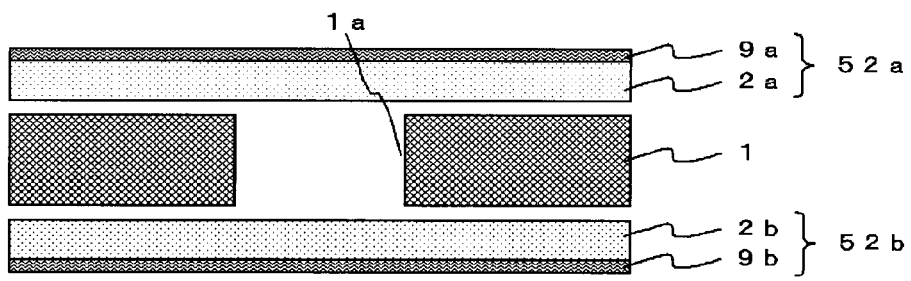

In the processes of forming the insulation layers 50a and 50b, as shown in FIG. 2A, the metal plate 1 is prepared and the first throughholes 1a are formed in the first place. Next, resin sheets 52a and 52b that having been covered with release films 9a and 9b stuck on one surface of each of the prepregs 2a and 2b, respectively, are prepared to be layered in such a way that the bare surfaces of the prepregs 2a and 2b each are opposed to the surfaces of the metal plate 1 having been provided with the first throughholes 1a as shown in FIG. 2B. The prepregs 2a and 2b used here are in a partially cured state, which is so called as B-stage. A film such as polyethylene terephthalate (PET) is used for the release films.

Figure 2C:
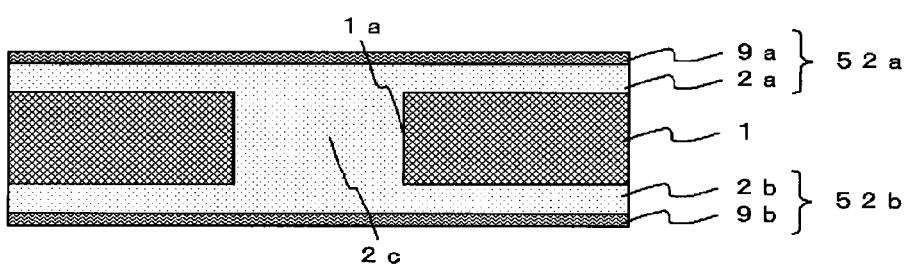

The resin sheets 52a and 52b thus layered are then hot-pressed under a vacuum condition. As shown in FIG. 2C, the prepregs 2a and 2b are melted, so the first throughholes 1a are filled therewith out voids nor recesses and the metal plate 1 is laminated therewith. After the lamination, the release films 9a and 9b are removed.

Figure 2D:
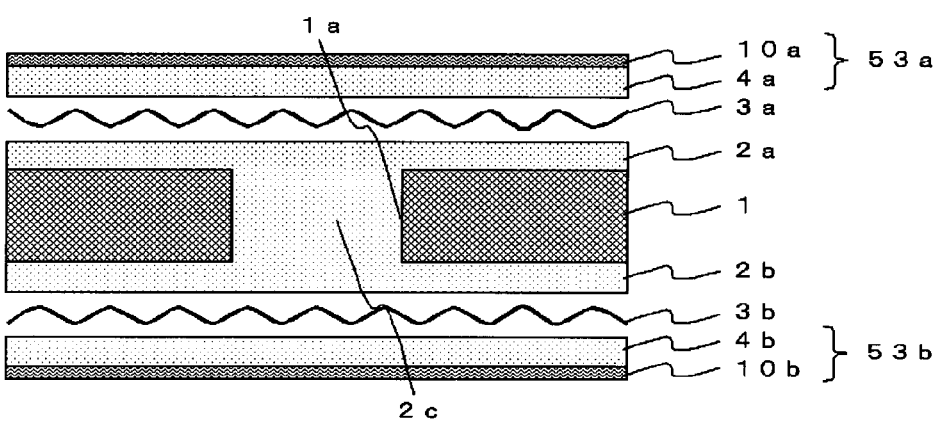

Next, as shown in FIG. 2D, resin sheets 53a and 53b are prepared that have been covered with release films 10a and 10b stuck on one surface of each of the prepregs 4a and 4b, respectively, and are layered in such a way that the bare surfaces of the prepregs 4a and 4b each are opposed to the surfaces of the metal plate 1 having been laminated with the prepregs 2a and 2b, with the glass clothes 3a and 3b being sandwiched between the prepregs 4a and 2a, and between the prepregs 4b and 2b, respectively. The prepregs 4a and 4b used here are in a partially cured state (B-stage).

Figure 2E:
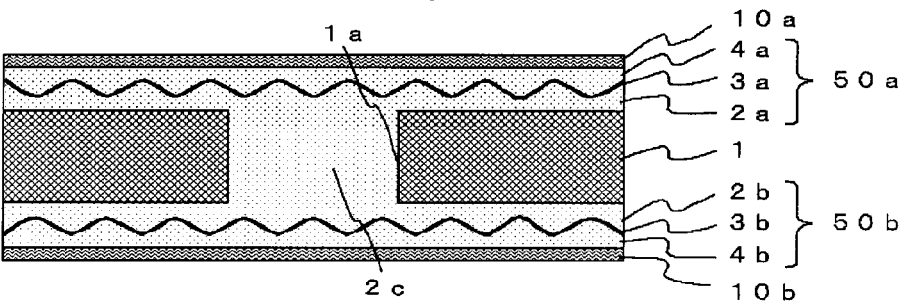

The resin sheets 53a and 53b thus layered are then hot-pressed under a vacuum condition. As shown in FIG. 2E, the prepregs 4a and 4b and the prepregs 2a and 2b are melted, so that the glass clothes 3a and 3b are laminated with the prepregs 4a and 2a, and the prepregs 4b and 2b as being sandwiched therebetween, respectively. Further keeping the hot-press, the prepregs 2a, 2b, 4a, and 4b become completely cured. Thereby, the insulation layers 50a and 50b are formed on the metal plate 1.

Figure 3A:
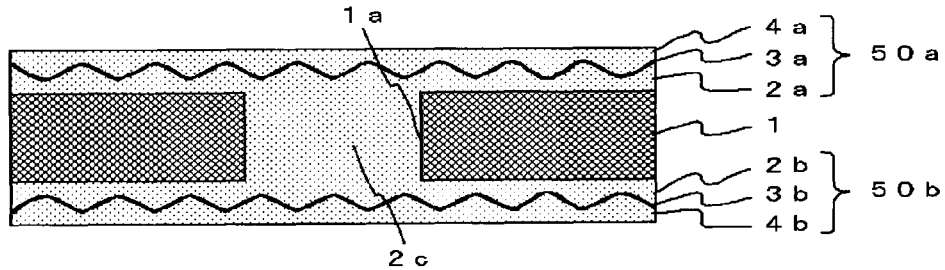
FIGS. 3A through 3D are views illustrating processes in the method of manufacturing the printed circuit board of Embodiment 1 according to the invention.
Figure 3B:
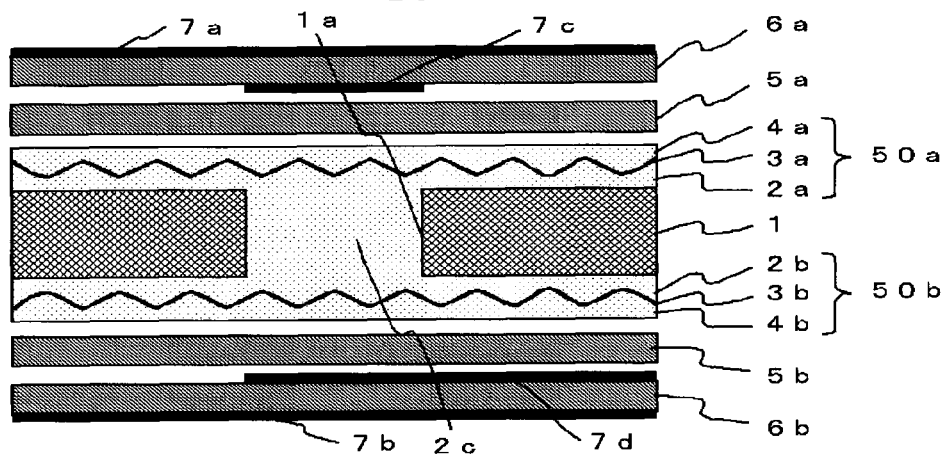

In the processes of forming the circuit layers 51a and 51b, as shown in FIG. 3A, the release films 10a and 10b are removed from the insulation layers 50a and 50b formed on the metal plate 1 in the first place. Next, as shown in FIG. 3B, prepregs 6a and 6b provided with the wiring layers 7a and 7c, and 7b and 7d formed thereon, respectively, are prepared to be layered in such a way that the surfaces of the prepregs 6a and 6b, on which the wiring layers 7c and 7d are formed, respectively, each are opposed to the outer surfaces of the insulation layers 50a and 50b, with the prepregs 5a and 5b being sandwiched between the prepreg 6a and the insulation layer 50a, and between the prepreg 6b and the insulation layer 50b, respectively.

The prepregs 5a and 5b are used that are in a partially cured state (B-stage). The prepregs 6a and 6b are used that are provided with the wiring layers 7c and 7d having been formed in predetermined patterns on one surface each thereof, respectively, after laminated with a copper foil on both surfaces each thereof and completely cured. Incidentally, the prepregs 5a, 5b, 6a, and 6b used here are ordinary ones made of a glass cloth impregnated with thermosetting resin.

Figure 3C:
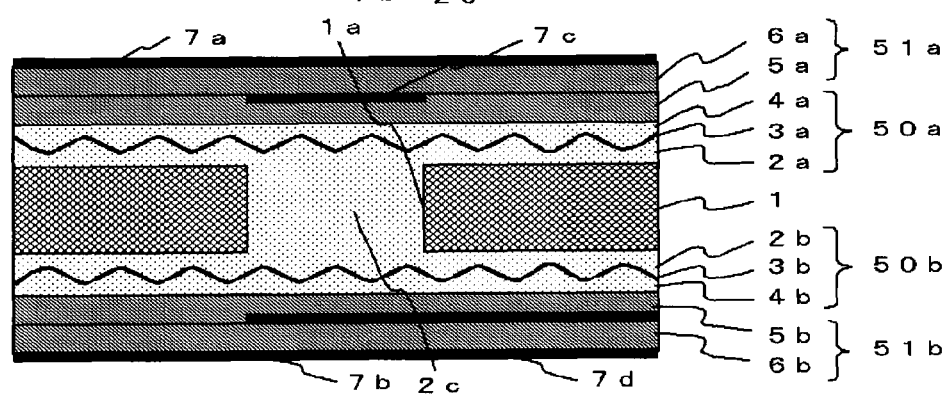

The prepregs 6a and 6b thus layered are then hot-pressed under a vacuum condition. As shown in FIG. 3C, the prepregs 5a and 5b are melted so as to stick the prepregs 6a and 6b on the outer surfaces of the insulation layers 50a and 50b, respectively, with level differences of the wiring layers 7c and 7d being filled with the prepregs 5a and 5b. Further keeping the hot-press, the prepregs 5a, 5b, 6a, and 6b become completely cured, so that the circuit layers 51a and 51b each are formed on the outer surfaces of the insulation layers 50a and 50b, respectively.

Figure 3D:
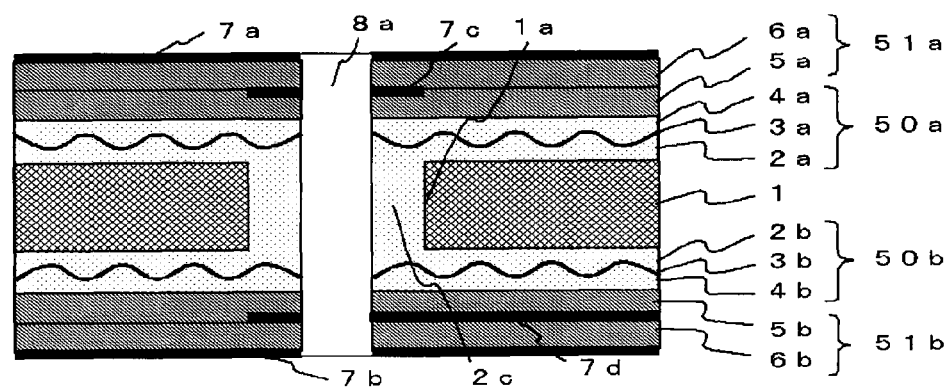

Next, as shown in FIG. 3D, throughholes 8a for the second throughholes 8, whose diameters are smaller than those of the first throughholes 1a that have been filled with the prepregs 2a and 2b, are provided coaxially with the first throughholes 1a.

After the second throughholes 8 are formed by being plated with copper on the inner walls thereof, the wiring layers 7a and 7b are patterned in predetermined patterns. Furthermore, solder coating such as route processing, solder resist coating, and hot air solder leveling is carried out as a post-process. Thereby, the printed circuit board 100 shown in FIG. 1 is obtained.

As has been explained above, in Embodiment 1, since the prepregs 2a and 2b, and 4a and 4b containing inorganic filler are used for the insulation layers 50a and 50b with which the metal plate 1 that is the core layer is laminated, heat can be efficiently transferred from heat generating components to the core layer through the inner walls of the second throughholes and the resin-filled portions. Therefore, heat dissipation performance can be improved.

Moreover, since the prepregs 2a and 2b, and 4a and 4b are laminated in multi-layers, the first throughholes can be filled with the resin-filled portions without voids. Therefore, reliability of the second throughholes can also be improved.

While the explanation in Embodiment 1 has been made on the case of using the prepregs 2a and 2b, and 4a and 4b containing inorganic filler for the insulation layers 50a and 50b, a prepreg further containing elastomer may be used therefor. In that case, cracks can be suppressed from occurring in the resin-filled portions around the first throughholes due to reduction in elasticity, which improves mounting reliability.

As for elastomer, carbon-terminated butadiene-acrylonitrile (CTBN), amine-terminated butadiene-acrylonitrile (ATBN), and the like can be used from a viewpoint of compatibility.

Since fluidity of resin is reduced by containing elastomer in a prepreg, inorganic filler content thereof can be increased, which further improves heat dissipation performance. A rate of the inorganic filler content in prepreg layers and that of the elastomer content in the resin of prepreg layers are preferably 80%-vol. or less and 50%-vol. or less, respectively.

When a rate of the inorganic filler content exceeds 80%-vol., performance of filling the first throughholes 1a deteriorates. On the other hand, when a rate of the elastomer content exceeds 50%-vol., sticking property of prepregs deteriorates.

While the explanation in Embodiment 1 has been made on the case of using the metal plate 1 for the core layer, a CFRP plate may also be used therefor. In that case, not only a printed circuit board of lightweight and high strength can be obtained but also heat dissipation performance can be improved by containing inorganic filler in the prepregs. Moreover, containing elastomer in the prepregs, cracks can be suppressed from occurring in the resin-filled portions around the first throughholes, which improves reliability of the second throughholes.

In cases of using a CFRP plate for the core layer, a rate of inorganic filler content in prepreg layers and that of elastomer content in the resin of prepreg layers are preferably 60-80%-vol. and 10-50%-vol., respectively.

When a rate of inorganic filler content exceeds 80%-vol., performance of filling the first throughholes 1a deteriorates. On the other hand, when a rate of the elastomer content exceeds 50%-vol., sticking property of prepregs deteriorates. In cases of a rate of the inorganic filler content being less than 60%-vol. or that of the elastomer content, less than 10%-vol., cracks occur around the first throughholes in the core layer, which reduces reliability of the second throughholes.

Figure 4:
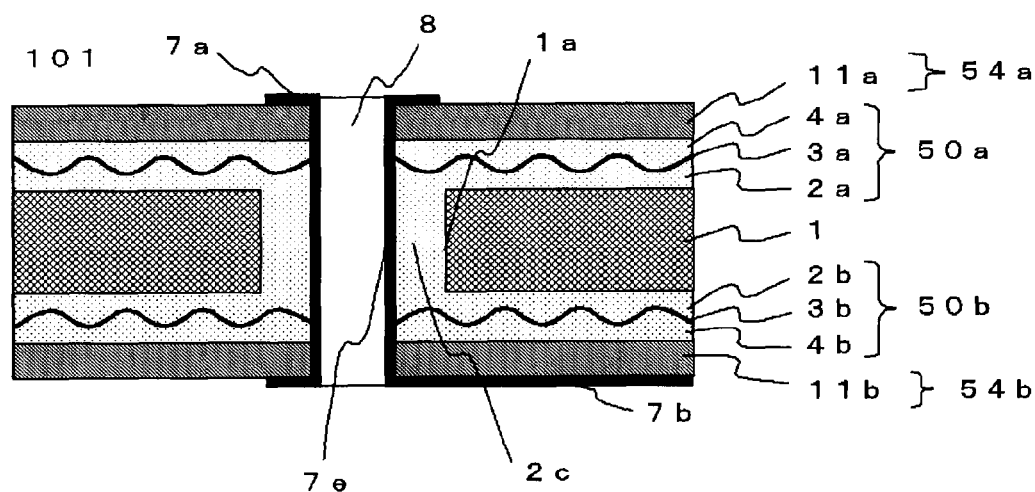
FIG. 4 is a cross-sectional view illustrating a configuration of another aspect of the printed circuit board of Embodiment 1 according to the invention.

Moreover, while the explanation in Embodiment 1 has been made on the case of the circuit layers 51a and 51b being laminated in a total of four layers, lamination of the circuit layers is not limited to this. For example, in the process of hot-pressing the resin sheets 53a and 53b shown in FIG. 2D under the vacuum condition, suspending the hot-press after the resin sheets 53a and 53b are laminated, circuit layers provided with wiring layers may be directly stuck on the prepregs 4a and 4b that are in a partially cured state (B-stage). FIG. 4 illustrates a printed circuit board 101 that is laminated with circuit layers 54a and 54b by directly sticking prepregs 11a and 11b having been provided with the wiring layers 7a and 7b thereon, respectively.

Figure 5:
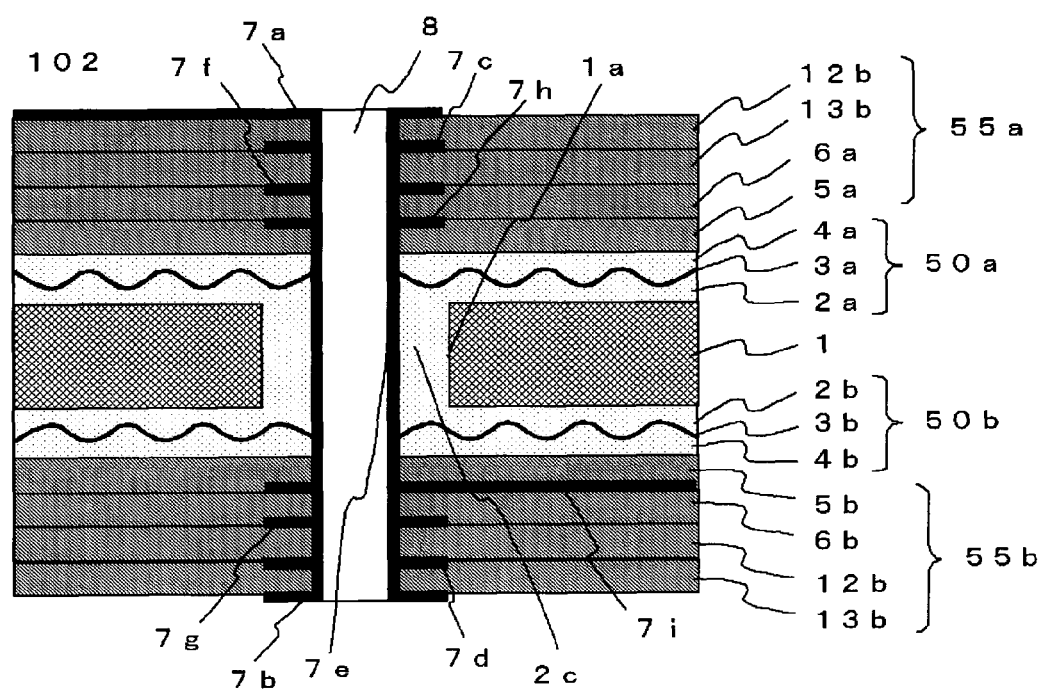
FIG. 5 is a cross-sectional view illustrating sill a configuration of sill another aspect of the printed circuit board of Embodiment 1 according to the invention.

Furthermore, sticking prepared circuit layers each composed of four layers on the prepregs 4a and 4b, for example, then a printed circuit board 102 will also be obtained that is laminated with circuit layers 55a and 55b in a total of eight layers as shown in FIG. 5.

PRACTICAL EXAMPLES

A detailed explanation will be made with reference to practical and comparative examples. Evaluations and property measurements employed for the practical and comparative examples were carried out using the following methods.
(1) Thermal Conductivity Thermal conductivity was measured (unit: W/mK) with a thermal conductivity measurement apparatus ("LFA447" manufactured by NETZSCH) in accordance with ASTM-E1461.
(2) Melt Viscosity Melt viscosity was measured (unit: Pa·s) under conditions similar to those of the vacuum hot-press with a melt-viscosity measurement apparatus ("Dynamic Analyzer RDA2" manufactured by Pheometrics) using cylindrical specimens of 12.6 mm diameter cut from prepregs.
(3) Filling Performance, Throughhole Reliability, and Sticking Performance Filling performance, throughhole reliability, and sticking performance were visually evaluated, by observing under a microscope, cross-sections of fabricated printed-circuit boards after having been subject to a heat cycle test. The heat cycle test was performed 500 cycles: one cycle was exposure of the circuit boards at −65° C. for 15 min. and at 125° C. for 15 min. Evaluation criteria were as follows:
 Filling Performance good: presence of no voids, NG: presence of voids;
 Throughhole Reliability good: presence of no cracks, NG: presence of cracks; and
 Sticking Performance good: presence of no peelings, NG: presence of peelings.
(4) Particle Size Particle size was measured (unit: μm) with a particle size analyzer ("LA-920" manufactured by HORIBA) by means of laser diffractometry in accordance with JIS-R-1620.

Practical Examples 1-9 and Comparative Examples 1-3

An aluminum plate (0.5 mm thick, 405 mm long, and 340 mm wide) was prepared as the metal plate 1 for a core layer, and the first throughholes 1a of 1.5 mm diameter were drilled therethrough (refer to FIG. 2A).

Next, the resin sheets 52a and 52b composed of the release films 9a and 9b and the prepregs 2a and 2b containing inorganic filler at the rates indicated in FIG. 6 and the resin sheets 53a and 53b composed of the release films 10a and 10b and the prepregs 4a and 4b were prepared. An alumina having particle sizes of 0.1-50 μm were used for the inorganic filler, and epoxy resins of 240 μm and 120 μm thick, which were in a partially cured state (B-stage), were used for the prepregs 2a and 2b, and 4a and 4b, respectively.

Next, the resin sheets 52a and 52b were layered with the aluminum plate being sandwiched therebetween (refer to FIG. 2B), and the prepregs 2a and 2b were vacuum-laminated (refer to FIG. 2C). In the vacuum lamination, the prepregs 2a and 2b, after being vacuumed at 150° C. for one minute, were hot-pressed at 10 kg/cm² for two minutes. The hot-pressed prepregs has preferably a minimum melt viscosity 30,000 Pa·s or less. With a melt viscosity over 30,000 Pa·s, filling performance of the first throughholes 1a deteriorates.

Next, the release films 9a and 9b were removed and the resin sheets 53a and 53b were layered with the glass clothes 3a and 3b of 55 μm thick being sandwiched between the prepreg 2a and the sheet 53a, and between the prepreg 2b and the sheet 53b, respectively, (refer to FIG. 2D). Then, the prepregs 4a and 4b were laminated in a vacuum (refer to FIG. 2E). In the vacuum lamination, the prepregs 4a and 4b, after being vacuumed at 150° C. for twenty seconds, were hot-pressed at 10 kg/cm² for twenty seconds. Subsequently, the temperature was elevated at a rate of 3° C./min and a hot-press was performed at 190° C. and 30 kg/cm² for one hour. Thereby, the insulation layers 50a and 50b completely cured were obtained.

Next, the prepregs 6a and 6b of 200 μm thick, which were provided with the wiring layers 7a and 7c, and 7b and 7d of 70 μm thick thereon, respectively, were layered on the insulation layers 50a and 50b that were formed on the aluminum plate (refer to FIG. 3A), with the prepregs 5a and 5b, which were in a partially cured state (B-stage), being sandwiched between the insulation layer 50a and the prepreg 6a, and between the insulation layer 50b and the prepreg 6b, respectively (refer to FIG. 3B). Then, the insulation layers 50a and 50b were laminated by hot-pressing the prepregs 6a and 6b at 180° C. and 30 kg/cm² for one hour after the temperature were elevated at a rate of 3° C./min. Thereby, the circuit layers 51a and 51b completely cured were obtained (refer to FIG. 3C). Incidentally, an ordinary prepreg, which is made of a glass cloth impregnated with epoxy resin, was used for the prepregs 5a, 5b, 6a, and 6b.

Next, the throughholes 8a of 0.9 mm diameter for the second throughholes 8 were provided coaxially with the first throughholes 1a, in the aluminum plate that had been laminated with up to the circuit layers 51a and 51b (refer to FIG. 3D). After the second throughholes 8 were subsequently formed by being plated with copper on the inner walls of the throughholes 8a, the wiring layers 7a and 7b were patterned in predetermined patterns. Furthermore, solder coating such as route processing, solder resist coating, and hot air solder leveling was carried out as a post-process. Thereby, printed circuit boards were obtained (refer to FIG. 1).

Evaluation results of the printed circuit boards according to practical examples 1 through 9 and comparative examples 1 through 3 are shown in FIG. 6 with regard to formability of B-stage sheet, thermal conductivity, filling performance, throughhole reliability, and sticking performance. Apparently from the results shown in FIG. 6, it is found that whereas the comparative example 1 containing no alumina inorganic filler indicates a low thermal conductivity of 0.2 W/mK, the practical examples 1 through 9 containing alumina indicate that their thermal conductivity increase with increasing rate of the alumina content.

In particular, when a rate of the alumina content in the prepreg layers is in a range of 65 to 75%-vol., a thermal conductivity of 3 W/mK or more was obtained, which brings about sufficient heat dissipation performance. However, filling performance deteriorates at an alumina content rate of 80%-vol., and formability of B-stage sheet becomes difficult at a rate of the alumina content of 85%-vol.

Practical Examples 10-21 and Comparative Examples 4-10

Using an aluminum plate for the core layer, and a prepreg containing alumina and elastomer, printed circuit boards were fabricated in a manner similar to those of the practical examples 1 through 9, with the mixing ratio of alumina and elastomer contents being varied as indicated in FIG. 7. Incidentally, CTBN was used for the elastomer.

Evaluation results of the printed circuit boards according to practical examples 10 through 21 and comparative examples 4 through 10 are shown in FIG. 7. It is found that by containing CTBN in the resin of the prepreg layers in a range of 5 to 30%-vol., a rate of alumina content in the prepreg layers is allowed to extend 80%-vol. or less; thereby the thermal conductivity is further improved. In a case of containing CTBN at 30%-vol., a thermal conductivity of 8 W/mK was obtained at an alumina content rate of 80%-vol.

Even in a case of an alumina content rate of 80%-vol., a small CTBN content of 10%-vol. deteriorates filling performance. In contrast, even in a case of containing CTBN at 30%-vol., an alumina content rate of 85%-vol. makes formability of B-stage sheet difficult. Moreover, it is found that when a rate of CTBN content exceeds 50%-vol., sticking performance of the prepreg deteriorates even at an alumina content rate of 75%-vol.

Practical Examples 22-24 and Comparative Examples 11 and 12

Using as a core layer a CFRP plate of 0.5 mm thick, 405 mm long, and 340 mm wide instead of the aluminum plate, and prepregs containing alumina at the rates indicated in FIG. 8, printed circuit boards were fabricated in a manner similar to those of the practical examples 1 through 9.

Evaluation results of the printed circuit boards according to practical examples 22 through 24 and comparative examples 11 and 12 are shown in FIG. 8. In a range of 60 to 70%-vol. of alumina content in the prepreg, thermal conductivity is improved similarly to the practical examples 1 through 9. In a range of 65 to 70%-vol. of alumina content, in particular, thermal conductivity of 3 W/mK or more is obtained, which brings about sufficient heat dissipation performance. In the examples of an alumina content rate being out of the range, throughhole reliability deteriorates even at the content rate of 50%-vol. and 75%-vol.

Practical Examples 25-35 and Comparative Examples 13-20

Printed circuit boards were fabricated in a manner similar to those of the practical examples 1 through 9, with the mixing ratio of alumina and CTBN contents being varied as indicated in FIG. 9, using the CFRP plate for the core layer, and prepregs containing alumina.

Evaluation results of the printed circuit boards according to practical examples 25 through 35 and comparative examples 13 and 20 are shown in FIG. 9. It is found that by containing CTBN in the resin of the prepreg layers in a range of 10 to 30%-vol., even in a case of using the CFRP plate for the core layer, a rate of alumina content in the prepreg layers in a range of 65%-vol. to 80%-vol. allows the printed circuit boards to be manufactured with high throughhole reliability. In a case of containing CTBN at 20 to 30%-vol., a thermal conductivity of 8 W/mK was obtained at an alumina content rate of 80%-vol.

In a case of a small CTBN content rate of 5%-vol., throughhole reliability deteriorates even at an alumina content rate of 75%-vol. Even though a CTBN content rate is 10%-vol., in a case of an alumina content rate being 80%-vol., filling performance deteriorates, and in a case of the rate being 85%-vol., formability of B-stage sheet becomes also difficult. A case of a CTBN content rate over 50%-vol. shows deterioration in sticking performance of the prepreg even at an alumina content rate of 75%-vol.

Embodiment 2

FIG. 10 is a cross-sectional view illustrating a configuration of a printed circuit board 200 in Embodiment 2. Referring to FIG. 10, the printed circuit board 200 is formed with insulation layers 60a and 60b each on the surfaces of a CFRP plate 21 as a CFRP core layer, and with circuit layers 61a and 61b on the outer surfaces of the insulation layers 60a and 60b, respectively.

The insulation layers 60a and 60b are composed of prepregs 22a and 22b, glass clothes 23a and 23b, and prepregs 24a and 24b, respectively, which are laminated successively in that order. The circuit layers 61a and 61b are composed of prepregs 25a and 25b, and prepregs 26a and 26b, respectively, which are also laminated successively in this order. The prepregs 26a and 26b are provided with wiring layers 27a and 27c, and 27b and 27d formed on the outer and inner surfaces thereof, respectively, in predetermined patterns.

The CFRP plate 21 is provided with first throughholes 21a whose walls and surroundings are covered with a metal film as a protection film. Here, a copper film 28 is used here for the metal film. Moreover, second throughholes 29, which penetrate the printed circuit board 200, are formed in the centers of the first throughholes 21a The wiring layers 27a and 27c, and 27b and 27d formed on the circuit layers 61a and 61b, respectively, are connected by wiring layers 27e formed on and along the second throughholes 29 so as to be electrically conducted to one another. The second throughholes 29 have diameters smaller than those of the first throughholes 21a so that the wiring layers 27e are electrical isolated from the surface of the CFRP plate 21 and surfaces covered with the copper film 28 by resin-filled portions 22c filled with the prepregs 22a and 22b.

The CFRP plate 21, as long as it is made of a composite material of carbon fiber and resin, is imposed no specific limitations with regard to its carbon fiber content rate and its structure such as a cross structure or a unidirectional structure. The cross structure used here denotes a structure of a composite material containing cross-woven fibers and the unidirectional structure used here denotes that of a composite material containing unidirectional fibers. Using laminated prepregs containing carbon fibers (cross structure) having a thermal conductivity of 500 W/mK, a core material is obtained that is more lightweight than aluminum while having a heat dissipation performance of the same level as that of aluminum.

Thermosetting resin containing inorganic filler and elastomer is used for the prepregs 22a and 22b, the filled portions 22c, and the prepregs 24a and 24b. Prepregs made of a glass cloth impregnated with thermosetting resin are used for the prepregs 25a and 25b, and 26a and 26b.

As the inorganic filler, alumina, silica, magnesia, aluminum nitride, boron nitride, silicon nitride and the like are known and at least one of them is used. As for the elastomer, carbon-terminated butadiene-acrylonitrile (CTBN), amine-terminated butadiene-acrylonitrile (ATBN), and the like can be used from a viewpoint of compatibility. The following materials are used as the thermosetting resin: epoxy, bismaleimide, cyanate ester, polyimide, and the like.

Next, the manufacturing method will be explained. FIGS. 11 through 13 are cross-sectional views illustrating processes of manufacturing the printed circuit board 200 in Embodiment 2. FIGS. 11A through 11D illustrate processes of covering with the copper film 28, FIGS. 12A through 12D, those of forming the insulation layers 60a and 60b, and FIG. 13A through 13D, those of forming the circuit layers 61a and 61b.

First, in the processes of covering with the copper film 28, the CFRP plate 21 is prepared that is clad with copper on both surfaces thereof, and soft etching is applied thereto to reduce the thickness of the copper film 28, as shown in FIG. 11A. Next, the first throughholes 21a are formed as shown in FIG. 11B. Subsequently, as shown in FIG. 11C, all surfaces of the CFRP plate 21 are plated with copper, so that inner walls 28a of a copper film are also formed on the walls of the first throughholes 21a. Furthermore, as shown in FIG. 11D, lands 28b are formed by patterning the copper film 28.

In the processes of forming the insulation layers 60a and 60b, as shown in FIG. 12A, resin sheets 62a and 62b are prepared that have been covered with release films 30a and 30b stuck on one surface of each of the prepregs 22a and 22b, respectively, in the first place, and are layered in such a way that bare surfaces of the prepregs 22a and 22b each are opposed to the surfaces of the CFRP plate 21 having been provided with the inner walls 28a and lands 28b. The prepregs 22a and 22b used here are in a partially cured state (B-stage). A film such as polyethylene terephthalate (PET) is used for the release films.

The resin sheets 62a and 62b thus layered are then hot-pressed under a vacuum condition. As shown in FIG. 12B, the prepregs 22a and 22b are melted so as to fill the first throughholes 21a without voids nor recesses and laminate the CFRP plate 21. After the lamination, the release films 30a and 30b are removed.

Next, as shown in FIG. 12C, resin sheets 63a and 63b are prepared that have been covered with release films 31a and 31b on one surface of each of the prepregs 24a and 24b, respectively, and are layered in such a way that bare surfaces of the prepregs 24a and 24b each are opposed to the surfaces of the metal plate 21 having been laminated with the prepregs 22a and 22b, with the glass clothes 23a and 23b being sandwiched between the prepregs 24a and 22a, and between the prepregs 24b and 22b, respectively. The prepregs 24a and 24b used here are in a partially cured state (B-stage).

The resin sheets 63a and 63b thus layered are then hot-pressed under a vacuum condition. Thereby, the prepregs 24a and 24b and the prepregs 22a and 22b are melted so as to laminate the CFRP plate 21, with the glass clothes 23a and 23b being sandwiched between the prepregs 24a and 22a, and between the prepregs 24b and 22b, respectively. Further keeping the hot-press, the prepregs 22a, 22b, 24a, and 24b become completely cured so that the insulation layers 60a and 60b are formed on the CFRP plate 21.

In the processes of manufacturing the circuit layers 61a and 61b, as shown in FIG. 13A, the release films 31a and 31b are removed from the insulation layers 60a and 60b formed on the CFRP plate 21 in the first place. Next, as shown in FIG. 13B, the prepregs 26a and 26b having been formed with the wiring layers 27a and 27c, and 27b and 27d thereon, respectively, are prepared and layered in such a way that the surfaces of the prepregs 26a and 26b, on which the wiring layers 27c and 27d are formed, are opposed to one surface of each of the prepregs 25a and 25b, respectively, with the prepregs 25a and 25b being sandwiched between the insulation layer 60a and the prepreg 26a, and between the insulation layer 60b and the prepreg 26b, respectively.

The prepregs 25a and 25b are used that are in a partially cured state (B-stage). The prepregs 26a and 26b are used that are provided with the wiring layers 27c and 27d formed in predetermined patterns on one surface each thereof, respectively, after laminated with a copper foil on both surfaces each thereof and having been completely cured. The prepregs 25a, 25b, 26a, and 26b used here are ordinary ones made of a glass cloth impregnated with thermosetting resin.

The prepregs 26a and 26b thus layered are then hot-pressed under a vacuum condition. Thereby, as shown in FIG. 13C, the prepregs 25a and 25b are melted so that the prepregs 26a and 26b are stuck to the outer surfaces of the insulation layers 60a and 60b, respectively, with steps of the wiring layers 27c and 27d being filled with the prepregs 25a and 25b. Further keeping the hot-press, the prepregs 25a, 25b, 26a, and 26b become completely cured, so that the circuit layers 61a and 61b are formed on the outer surfaces of the insulation layers 60a and 60b, respectively.

Next, as shown in FIG. 13D, throughholes 29a for the second throughholes 29, which have diameters smaller than those of the first throughholes 21a having been filled with the prepregs 22a and 22b, are formed coaxially with the first throughholes 21a. After the second throughholes 29 have been formed by being plated with copper on the inner walls thereof, the wiring layers 27a and 27b are patterned in predetermined patterns. Furthermore, solder coating such as route processing, solder resist coating, and hot air solder leveling is carried out as a post-process. Thereby, the printed circuit board 200 shown in FIG. 10 is obtained.

As has been explained above, according to Embodiment 2, an excellent heat dissipation performance can be brought about, and at the same time, carbon powder can be prevented from generating by covering with the copper film 28 the walls of the first throughholes 21a that are formed in the CFRP plate 21. Thereby, insulation performance between the CFRP plate and the second throughholes does not deteriorate, which brings about improvement of insulation reliability. Moreover, the carbon powder can be prevented from dispersing into the substrate manufacturing equipment, contaminating the other substrates, and causing a short circuit.

Furthermore, by providing the lands 28b around the first throughholes 21a, the holes formed in the CFRP plate are easy to be identified as fiducial holes by using X-ray, which can prevent a short circuit caused by contact of the second throughholes with the CFRP plate.

Figure 14:
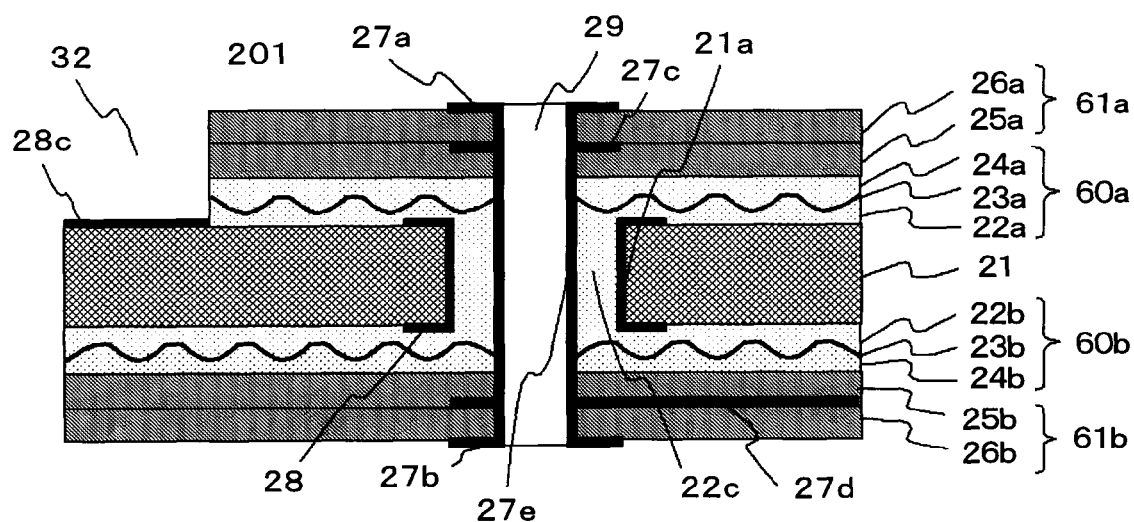
FIG. 14 is a cross-sectional view illustrating another configuration of the printed circuit board of Embodiment 2 according to the invention.

While the walls of the first throughholes formed in the CFRP plate 21 are covered with the copper film in Embodiment 2, the copper film 28c may be provided on counterbored portions 32 that are formed on the CFRP plate 21 as heat dissipation holes as shown in FIG. 14.

In that case, use of laser beam machining in forming the counterbored portions, different from a case of using machining such as milling, can stop counterboring just at the copper film 28c without scratches on the CFRP plate 21, which can prevent the carbon powder from being generated.

Embodiment 3

While the copper film 28 is used for the protection film in the printed circuit board of Embodiment 2, an explanation will be made on a case where a resin film is used therefor in Embodiment 3.

Figure 15:
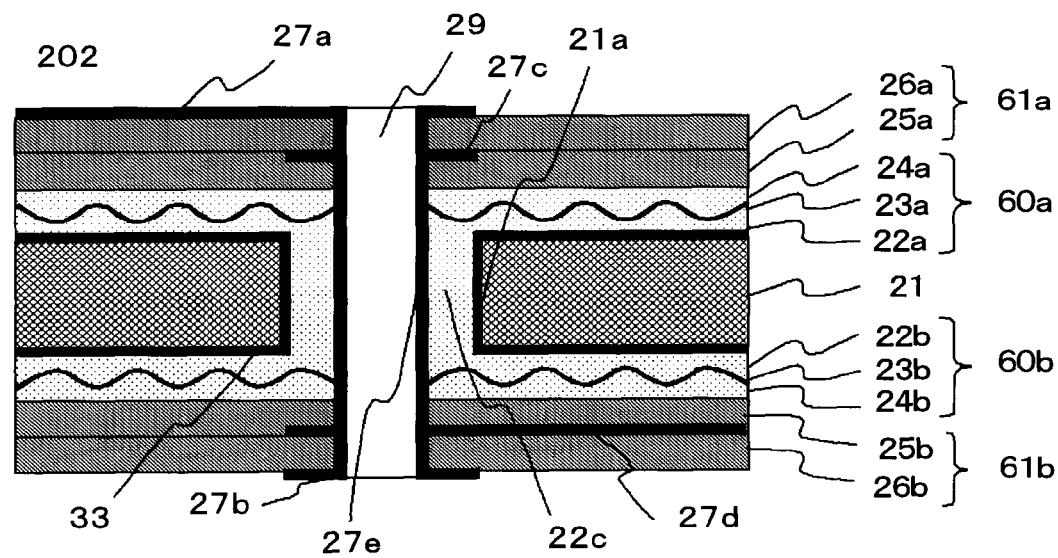
FIG. 15 is a cross-sectional view illustrating a configuration of a printed circuit board of Embodiment 3 according to the present invention.

FIG. 15 is a cross-sectional view illustrating a configuration of a printed circuit board 202 in Embodiment 3 of the present invention. Referring to FIG. 15, the walls and the surroundings of the first throughholes 21a in the CFRP plate 21 are covered with a resin film 33 as a protection film. Configurations other than that are the same as those in Embodiment 2 and the same reference numerals are assigned to parts equivalent to those in FIG. 10 and their explanations are omitted.

Figure 16A:
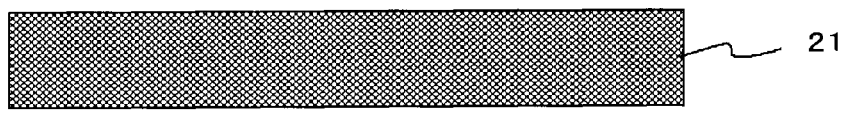
FIGS. 16A through 16C are views illustrating one of processes in a method of manufacturing the printed circuit board of Embodiment 3 according to the invention.
Figure 16B:
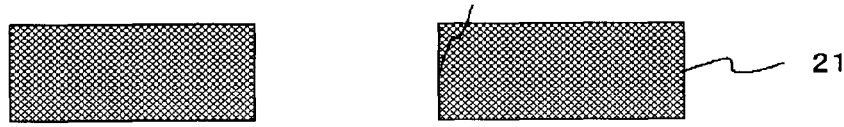
Figure 16C:
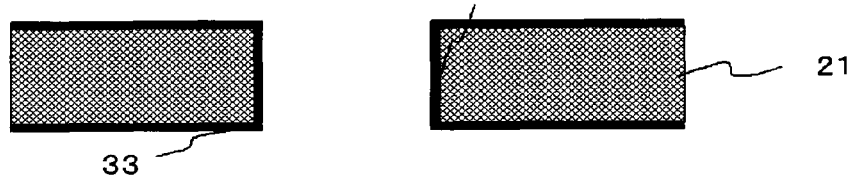

FIGS. 16A through 16C are cross-sectional views illustrating processes of manufacturing the printed circuit board 202 in Embodiment 3: FIGS. 16A through 16C illustrate processes of covering with the resin film 33. As show in FIG. 16A, the CFRP plate 21 is prepared and the first throughholes 21a are formed therein as shown in FIG. 16B.

Next, as shown in FIG. 16C, an uncured thermosetting resin diluted with a solvent is applied to the CFRP plate 21 having been provided with the first throughholes 21a. The resin film 33, after cured, is formed on the walls of the first throughholes 21a and both surfaces of the CFRP plate 21. Processes other than that are the same as those in Embodiment 2 and their explanations are omitted.

As described above, in Embodiment 3, by covering with the resin film 33 the walls of the first throughholes 21a formed in the CFRP plate 21, it is possible not only to prevent carbon powder from being generated but also to keep weight increase at a minimum even though the protection film is formed.

While, in Embodiment 3, the insulation layers 60a and 60b each are laminated using the prepregs containing the inorganic filler and the elastomer, with the glass clothes being sandwiched between the prepregs in each of the insulation layers 60a and 60b, the prepregs 25a and 25b, which are ordinary prepregs used in forming the circuit layers 61a and 61b, may be used for the insulation layers 60a and 60b at the same time.

Figure 17:
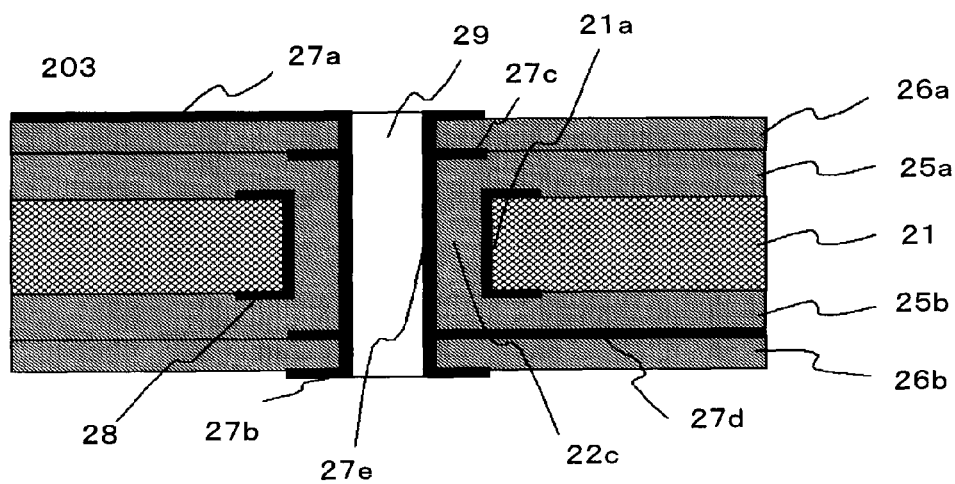
FIG. 17 is a cross-sectional view illustrating another configuration of the printed circuit board of Embodiment 3 according to the invention.

As shown in FIG. 17, the CFRP plate 21 is laminated with the prepregs 25a and 25b, with the filled portions 22c of the first throughholes 21a being filled therewith, so that the second throughholes 29 and the CFRP plate 21 are electrically isolated from each other and the prepregs 26a and 26b are stuck on the prepregs 25a and 25b, respectively, at the same time. In that case, the processes of forming the insulation layers 60a and 60b can be omitted, which simplifies the manufacturing processes.

PRACTICAL EXAMPLES

Next, practical examples will be presented and explained further in detail. Evaluations and property measurements employed in the practical examples were carried out using the following methods.
(1) Insulation Resistance A printed circuit board was fabricated with the counterbored portions 32 so that the insulation resistance from the counterbored portions 32 to the CFRP plate 21 and the second throughholes 29 was measured with an insulation resistance measurement instrument ("Moving Probe Tester EMMA 880" manufactured by MicroCraft). An insulation resistance of 65 MΩ or more at applied voltage of 250 V was set as decision criteria for acceptance.
(2) Cross-Section Observation Filling performance, through-hole reliability, and sticking performance were visually evaluated by observing under a microscope cross-sections of fabricated printed-circuit-boards after having been subject to a heat cycle test. The heat cycle test was performed 500 cycles: one cycle was exposure of the circuit boards at −65° C. for 15 min. and at 125° C. for 15 min.

Practical Example 1

First, the CFRP plate 21 (0.5 mm thick, 405 mm long, and 340 mm wide) was prepared that was laminated with carbon fiber (cross structure) having a thermal conductivity of 500 W/mK and clad with copper on both surfaces thereon, and a soft etching was applied to the surfaces of the CFRP plate 21, to reduce the thickness of the copper film 28 to approximately 6 μm (refer to FIG. 11A).

Next, the first throughholes 21a were formed in the CFRP plate 21 by drilling (refer to FIG. 11B). Then, a copper film of approximately 10 μm was formed on the walls of the first throughholes 21a and that of approximately 15 μm, on both surfaces of the CFRP plate 21 by copper-plating (refer to FIG. 11C). Subsequently, the lands 28 having an outer diameter of 1.8 mm were formed by patterning (refer to FIG. 11D).

Next, the resin sheets 62a and 62b, and 63a and 63b were prepared that were composed of the prepregs 22a and 22b and the release films 30a and 30b, and of the prepregs 24a and 24b and the release films 31a and 31b, respectively. The prepregs 22a and 22b, and 24a and 24b used there were made of epoxy resin of 240 μm and 120 μm thick, respectively, which were in a partially cured state (B-stage). The employed epoxy resin was made of a mixture of alumina filler and CTBN and had a thermal conductivity of 3 W/mK. The alumina filler employed there had particle sizes of 0.1 to 50 μm.

Next, the resin sheets 62a and 62b each were layered on the surfaces of the CFRP plate 21 formed with the lands 28 thereon and inner walls 28a therein (refer to FIG. 12A), and the prepregs 22a and 22b were laminated in a vacuum (refer to FIG. 12B). In the vacuum lamination, the prepregs 22a and 22b, after vacuumed at 150° C. for one minute, were then hot-pressed at 10 kg/cm² for two minutes.

Next, the release films 30a and 30b were removed, and the resin sheets 63a and 63b each were layered on the prepregs 22a and 22b, with the glass clothes 23a and 23b of 55 μm thick being sandwiched therebetween (refer to FIG. 12C), respectively, and the prepregs 24a and 24b were laminated in a vacuum (refer to FIG. 12D). In the vacuum lamination, the prepregs 24a and 24b, after vacuumed at 150° C. for twenty seconds, were then hot-pressed at 10 kg/cm² for twenty seconds. Subsequently, the temperature was elevated at a rate of 3° C./min and a hot-press was performed at 190° C. and 30 kg/cm² for one hour. Thereby, the insulation layers 60a and 60b completely cured were obtained.

Next, the prepregs 26a and 26b of 200 μm thick that had been provided with the wiring layers 27a and 27c, and 27b and 27d of 70 μm thick thereon, respectively, were layered on each surface of the CFRP plate 21 that had been formed with the insulation layers 60a and 60b thereon (refer to FIG. 13A), with the prepregs 25a and 25b of 60 μm thick in a partially cured state (B-stage) being sandwiched between the prepregs 24a and 24b and the prepregs 26a and 26b, respectively (refer to FIG. 13B). Then, the prepregs 26a and 26b were laminated by being hot-pressed at 180° C. and 30 kg/cm² for one hour after the temperature was elevated at a rate of 3° C./min. Thereby, the circuit layers 61a and 61b that had been completely cured were obtained (refer to FIG. 13C). Incidentally, an ordinary prepreg, which was made of a glass cloth impregnated with epoxy resin, was used for the prepregs 25a, 25b, 26a, and 26b.

Next, the throughholes 29a having a diameter of 0.9 mm for the second throughholes 29 were formed coaxially with the first throughholes 21a, in the CFRP plate 21 that had been laminated with up to the circuit layers 61a and 61b (refer to FIG. 13D). After the second throughholes 29 were subsequently formed by being plated with copper on the inner walls of the throughholes 29a, the wiring layers 27a and 27b were patterned in predetermined patterns. Furthermore, solder coating such as route processing, solder resist coating, and hot air solder leveling was carried out as a post-process. Thereby, a printed circuit board was obtained (refer to FIG. 10).

Inspecting the printed-circuit-board thus formed as to insulation between the CFRP plate 21 and the second throughholes 29, an insulation resistance more than 65 MΩ at 250 V was obtained. Moreover, the cross-section observation of the printed-circuit-board resulted in no abnormality with regard to peelings, cracks, and the like. The cross-section observation of the printed circuit board after having been subject to the heat cycle test also resulted in no particular abnormality.

Practical Example 2

First, the CFRP plate 21 (0.5 mm thick, 405 mm long, and 340 mm wide) was prepared that was laminated with carbon fiber (cross structure) having a thermal conductivity of 500 W/mK (refer to FIG. 16A), and the first throughholes 21a having a diameter of 1.5 mm were formed therein (refer to FIG. 16B).

Next, uncured epoxy resin that was diluted with methyl-ethyl-ketone was coated with approximately 10 μm on both surfaces of the CFRP plate 21 and the inner walls of the first throughholes 21a, and was cured by heating at 180° C. for one hour after dried at 50° C. (refer to FIG. 16C).

The insulation layers 60a and 60b and the circuit layers 61a and 61b were formed and the post-processing was performed in manners similar to those in Embodiment 1. Thereby, a printed circuit board was obtained (refer to FIG. 15).

Inspecting the printed-circuit-board thus formed as to insulation between the CFRP plate 21 and the second throughholes 29, an insulation resistance more than 65 MΩ at 250 V was obtained. Moreover, the cross-section observation of the printed-circuit-board resulted in no abnormality with regard to peelings, cracks, and the like. The cross-section observation of the printed circuit board after having been subject to the heat cycle test also resulted in no particular abnormality.

What is claimed is:

1. A printed circuit board comprising:
    a carbon-fiber-reinforced plastic core layer provided with a first throughhole therein;
    a metal protection film covering both surfaces of the core layer and an inner wall of the first throughhole;
    an insulation layer composed of cured prepregs, the insulation layer covering the both surfaces of the core layer covered with the protection film and the inner wall of the first throughhole;
    circuit layers each formed on the outer surfaces of the insulation layer, the circuit layers provided with wiring layers; and
    a second throughhole penetrating the core layer and the insulation layer and the circuit layers, the second throughhole formed coaxially with the first throughhole,
    wherein the inner wall of the second throughhole is plated to be electrically conductive with the wiring layers and
    the protection film covering the both surfaces of the core layer has a land encircling the first throughhole, wherein the land contacts the core layer and is covered by the insulation layer.

2. The printed circuit board as recited in claim 1, wherein the protection film is made of copper.

3. The printed circuit board as recited in claim 1, wherein the insulation layer contain inorganic filler and elastomer.

4. The printed circuit board as recited in claim 1, the insulation layer is composed of a first insulation layer covering the protection film and a second insulation layer covering the first insulation layer,
    wherein a glass cloth is sandwiched between the first insulation layer and the second insulation layer.

* * * * *